United States Patent [19]

Butt et al.

[11] Patent Number: 4,582,556

[45] Date of Patent: Apr. 15, 1986

[54] ADHESION PRIMERS FOR ENCAPSULATING EPOXIES

[75] Inventors: Sheldon H. Butt, Godfrey, Ill.; Edward F. Smith, III, Madison; F. Dennis Gyurina, West Haven, both of Conn.

[73] Assignee: Olin Corporation, New Haven, Conn.

[21] Appl. No.: 615,605

[22] Filed: May 31, 1984

Related U.S. Application Data

[62] Division of Ser. No. 443,793, Nov. 22, 1982, Pat. No. 4,525,422.

[51] Int. Cl.$^4$ ............................................. C09J 5/00
[52] U.S. Cl. ....................................... 156/325; 29/588; 156/245; 156/289; 156/307.5; 156/307.7; 174/52 PE; 264/135; 264/272.17; 427/410; 428/413; 428/469; 523/400; 523/455; 523/457
[58] Field of Search ..................... 156/289, 325, 307.7, 156/307.5, 245; 264/272.17, 135, 300; 29/588; 174/52 PE; 428/413, 469; 427/410; 523/400, 457, 455

[56] References Cited

U.S. PATENT DOCUMENTS

| 3,413,713 | 12/1968 | Helfa et al. ............................ 29/588 |
| 3,468,824 | 9/1969 | Williams .............................. 523/455 |
| 3,541,041 | 11/1970 | Hermann et al. .................... 264/300 |
| 3,677,828 | 7/1972 | Caule . |
| 3,716,427 | 2/1973 | Caule . |
| 3,728,177 | 4/1973 | Caule . |
| 3,728,178 | 4/1973 | Caule . |
| 3,764,399 | 10/1973 | Caule . |
| 3,764,400 | 10/1973 | Caule ............................... 156/307.5 |
| 3,833,433 | 9/1974 | Caule . |
| 3,837,929 | 9/1974 | Caule . |
| 3,853,691 | 12/1974 | Caule . |
| 3,940,303 | 2/1976 | Caule . |
| 3,941,627 | 3/1976 | Caule . |
| 3,941,628 | 3/1976 | Caule . |
| 3,944,449 | 3/1976 | Caule . |
| 3,988,284 | 10/1976 | Wurmb et al. ...................... 264/300 |
| 4,136,119 | 1/1979 | Payne .................................. 264/300 |
| 4,143,024 | 3/1979 | Adelmann et al. ................. 264/300 |
| 4,264,379 | 4/1981 | Caule .................................. 148/6.16 |
| 4,318,740 | 3/1982 | Koyama .......................... 174/52 FP |

FOREIGN PATENT DOCUMENTS

| 57-14013 | 1/1982 | Japan ................................. 264/300 |
| 771127 | 3/1957 | United Kingdom . |
| 1309299 | 3/1973 | United Kingdom . |
| 1510558 | 5/1978 | United Kingdom . |
| 2016807B | 7/1982 | United Kingdom . |
| 2093754A | 8/1982 | United Kingdom . |

OTHER PUBLICATIONS

Neighbour et al., "Factors Governing Aluminum Interconnection Corrosion in Plastic Encapsulated microelectronic Devices", *Microelectronics and Reliability*, Pergamon Press, Great Britain, vol. 16, 1977, pp. 161–164.

Kirk–othmer, *Encyclopedia of Chemical Technology*, 3rd Edition, John Wiley & Sons, vol. 1, pp. 1–9.

*Primary Examiner*—John J. Gallagher
*Attorney, Agent, or Firm*—Howard M. Cohn; Barry L. Kelmachter; Paul Weinstein

[57] ABSTRACT

A copper plastic laminate is provided having a high bond strength. The copper is selected from the group consisting of copper and copper alloys and has on its surface a uniform glassy-like, substantially pore-free coating of copper phosphate. A plastic encapsulating material containing a mold release agent is adhesively bonded to the copper.

9 Claims, 3 Drawing Figures

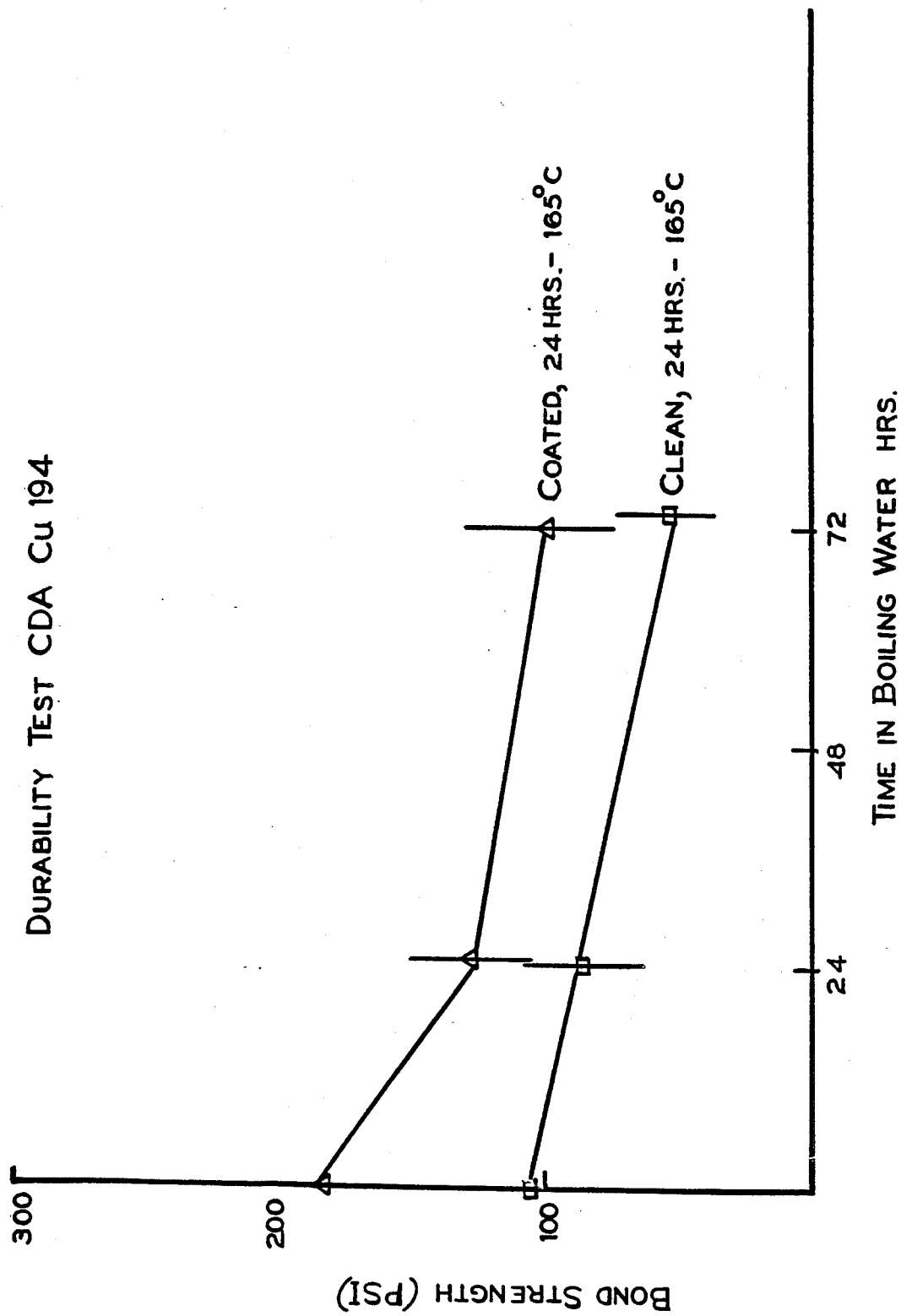

ADHESION PRIMERS FOR ENCAPSULATING EPOXIES

CROSS REFERENCE TO RELATED APPLICATION

This application is a Division of U.S. application Ser. No. 443,793, filed Nov. 22, 1982, by Sheldon H. Butt et al. for Adhesion Primers For Encapsulating Epoxies, now U.S. Pat. No. 4,525,422.

ADHESION PRIMERS FOR ENCAPSULATING EPOXIES

While the invention is subject to a wide range of applications, it is especially suited for encapsulating electrical leadframes with integrated circuits attached thereto and will be particularly described in that connection.

In the electronics industry, one of the basic types of semiconductor packages used for integrated circuits is the plastic molded package. The package may include a leadframe, having an electronic device attached thereto, molded into an encapsulating plastic. This type of plastic package often has reliability problems created by failures in the plastic to metal bond between the encapsulating plastic and the leadframe. The bond failure provides an avenue through which moisture and other atmospheric contaminants can reach the electric device and cause corrosion problems. Such failures are more fully explained and documented in an article entitled "Factors Governing Aluminum Interconnection Corrosion in Plastic Encapsulated Microelectronic Devices" by Neighbour and White published in *Microelectronics and Reliability*, by Pergamon Press in Great Britain, Volume 16, 1977, pages 161-164.

It is known in the prior art to produce a laminate of copper or copper alloys and plastic film. A laminating adhesive is applied between the metal and plastic film to bond them together. A high bond strength results between the copper or copper alloys and the plastic film due to a phosphate coating provided on the metal. Examples of this are disclosed in U.S. Pat. Nos. 3,677,828, 3,716,427, 3,728,177, 3,728,178, 3,764,399, 3,833,433, 3,837,929, 3,853,691, 3,940,303, 3,941,627, 3,941,628, and 3,944,449. However, the plastic film laminate disclosed in these patents do not contain mold release agents as set out in the present invention. Since the adhesive is commonly required only between the film and the metal, there is no reason to use a mold release agent. Further, if a mold release agent were used, it would only decrease the bond strength. The absence of mold release agents is significantly different from the present invention where the mold release agents are definitely required to prevent an encapsulating epoxy from sticking to a mold surface. Unfortunately, the mold release agent also hinders the encapsulant from sticking to an encapsulated metal strip such as a leadframe. The resulting bond between the encapsulant and the leadframe is often deficient and creates an avenue for contaminating an encapsulating electronic element attached to the leadframe.

It is a problem underlying the present invention to provide an encapsulated package for an electrical or electronic component which is highly resistant to atmospheric contamination.

It is an advantage of the present invention to provide a casing for an electrical or electronic component which obviates one or more of the limitations and disadvantages of the described prior arrangements.

It is a further advantage of the present invention to provide a hermetic casing for an electrical or electronic component which is substantially resistant to the diffusion of contaminants.

It is a yet further advantage of the present invention to provide a casing for an electrical or electronic component which is relatively inexpensive to manufacture.

Accordingly, there has been provided a casing adapted for containing an electrical or electronic component and a method of producing the casing. The casing includes a copper or copper alloy leadframe. An adhesion primer comprising a uniform, glassy and substantially pore-free phosphate coating is applied to the leadframe. Also, an encapsulating material containing a mold release agent is bonded to the copper leadframe to form a hermetic casing. In addition, the encapsulating epoxy may be adhered to copper or copper alloy material having an adhesion primer thereon whenever a strong bond is required.

The invention and further developments of the invention are now elucidated by means of the preferred embodiments shown in the drawings.

FIG. 3 is a graph of a durability test for coated and uncoated copper alloys.

Figure 1:
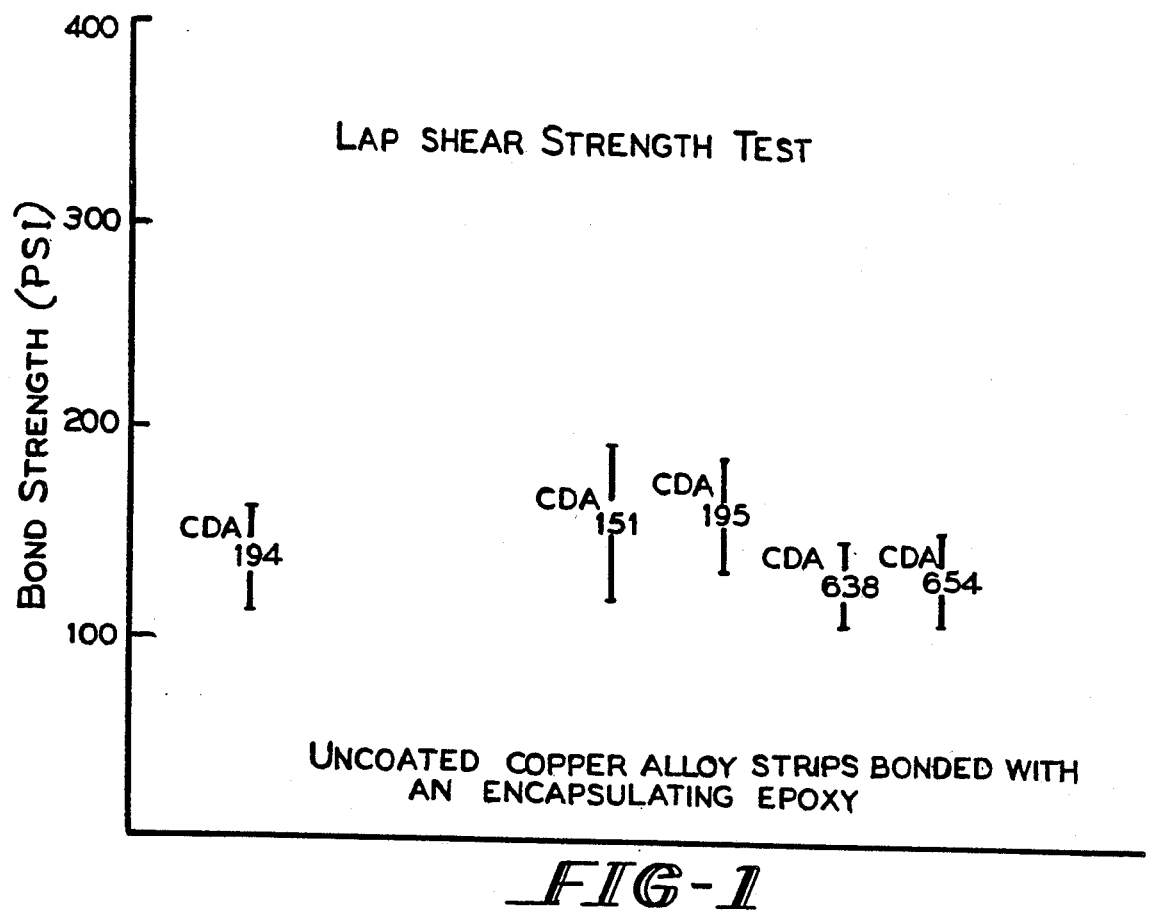
FIG. 1 is a graph of a lap shear strength test of uncoated copper alloys.

The present invention is primarily concerned with forming a strong bond between copper or copper alloy and an encapsulating epoxy or plastic. This is particularly important in semiconductor leadframe applications where the leadframe and semiconductor attached thereto are encapsulated by an encapsulating epoxy. Semiconductor devices are particularly sensitive to degradation and failure from exposure to moisture and/or penetration of atmospheric pollutants into the package through a path between the encapsulating molding compound and the leadframe. Although this is the primary application described herein, it is within the scope of the present invention to apply the treatment described herein wherever copper or copper alloys are molded into the general class of plastics or epoxies which contain mold release agents. The mold release agent also known as an abherent allows the hardened epoxy to release from the encapsulating mold and minimize redressing the mold after each use. Just as the mold release agent prevents the plastic or elastomer from sticking to the mold wall, it also reduces the strength of the bond between the metal or alloy leadframe and the plastic or elastomer.

The metal or alloy which is used in this invention is preferably copper or copper alloy. Also, this metal or alloy may be in any form such as sheets, strip, or foil.

The metal or alloy is coated with a uniform, glassy-like, substantially pore-free phosphate coating. This coating may be in the range of thickness from about 20 to about 100 Angstrom units. It may be applied using various techniques as set forth in the patents enumerated above. For example, the coating may be obtained by applying a phosphoric acid solution containing from about 3.5 grams per liter up to the solubility limit of sodium dichromate ($Na_2Cr_2O_7 \cdot 2H_2O$) or potassium dichromate ($K_2Cr_2O_7$) or mixtures thereof to the copper alloy material. Normally, the application of the aforementioned solution is by immersion of a sheet or strip of material into a bath of the abovementioned acid solution.

Another treatment which is thought to be advantageous in the present invention is disclosed in U.S. Pat. No. 4,264,379.

The treatment may be effected with an aqueous solution containing a low to moderate concentration of the phosphonic acid component or components, preferably ranging from about 0.1 to about 30 volume percent for liquid acids or corresponding weight percent limits for solid phosphonic acids, preferably in the range of about 0.1 to 40 percent by weight.

The treating solution also preferably includes a low to moderate concentration, such as about 0.1 to about 15.0 percent by weight, preferably 0.2 to 5.0 percent by weight of oxidizing agent, such as sodium or other alkali chromate or dichromate, or nitric acid (100 percent) at a concentration of about 0.05 to about 10.0 volume percent, preferably about 0.05 to about 2.0 percent by volume $HNO_3$. Other known oxidizing agents of similar activity may be used at a comparable dilute or moderate concentration effective for the purpose, but generally with avoidance of such vigorous oxidizing conditions as might cause substantial decomposition of the phosphonic acid.

Following the aforementioned immersion step, the copper alloy strip is rinsed and dried. The rinsing is normally carried out in running water although a spray rinse may also be readily employed. Drying may be accomplished by an air blast, rinsing in an alcohol solution such as methanol and allowing to dry, or merely by exposure to the atmosphere.

Following rinsing and drying, the treated surface of the copper sheet or strip is prepared for the attachment of semiconductors and the attachment of lead wires from the semiconductors to the coated leadframe or strip. In manufacturing the leadframe with a semiconductor device attached thereto, it may be desirable to silverplate a spot on the leadframe to enhance the connection of the wires from the semiconductor device to the leadframe. Further, the ends of the leadframe may be electrosolder plated to enhance the connection between the leadframe and another element to which it may be attached by a soldering operation. In any case, the glassy-like phosphate coating of the leadframe, in accordance with the present invention, is preferably accomplished after the addition of the silverplated spot and/or electrosolder plate because the coating does not substantially adhere to either the silver or the solder. Conversely, the silverplating and/or electrosolder plate may be applied after the phosphate coating has been applied because the coating does not prevent the adherence of the plating.

The semiconductor device is attached to the plated leadframe in any conventional manner. The leadframe may then be placed within a mold and encapsulated in any conventional manner with an epoxide resin formulated for integrated circuit encapsulation, preferably containing both mold release agents and inert fillers which are suitable for the invention described herein. The encapsulating epoxies are generally in the class of thermosetting plastic or polymers. They preferably contain mold release agents, such as low melting temperature organics, which allow release of the hardened epoxy from the mold and minimize mold redressing between uses. These mold release agents or abherents may include materials such as silicones, stearates and fatty acids. Examples of other abherents are described in the *Encyclopedia of Chemical Technology*, 3rd Edition, by Kirk-Othmer, published by John Wiley & Sons, Volume 1, page 1-9. The encapsulating epoxies may also contain inert fillers to provide dimensional and temperature stability. These fillers may be discrete particles such as glass fibers or silica.

Epoxy encapsulants, containing mold release agents, which are suitable for the present invention are Morton Polyset 410B manufactured by Morton Chemical Company and Plaskon 3100 and 3200 manufactured by Plaskon Electronic Materials, Inc.

Figure 2:
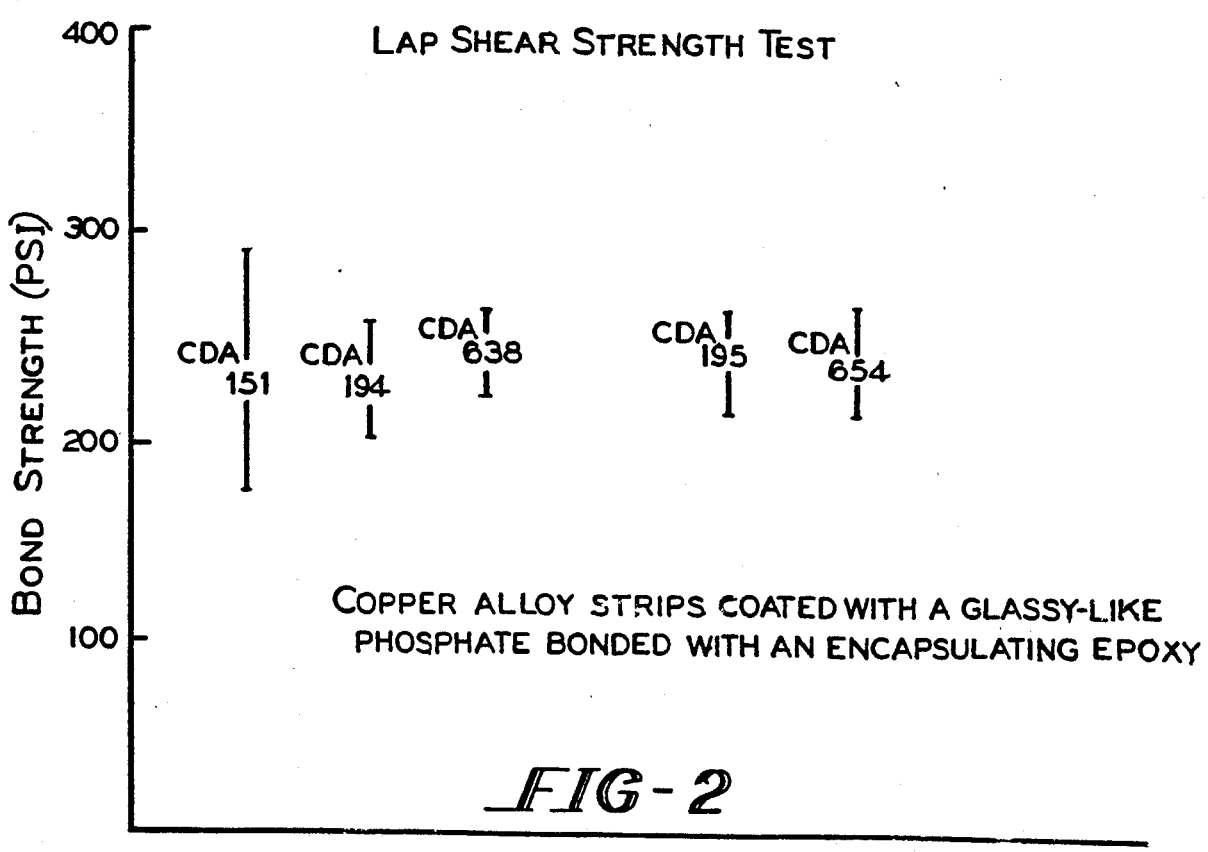
FIG. 2 is a graph of a lap shear strength test of coated copper alloys.

FIGS. 1-3 illustrate the experimental results exhibited during lap shear strength testing of samples. The lap shear strength test measures the bond strength in terms of shear strength. It is performed by overlapping two strips of the desired material and bonding them together with an epoxy. Then, the strips are pulled apart from each other exerting a shear stress at the bond.

Referring to FIG. 1, there is shown samples of uncoated CDA copper strip subjected to the lap test described above. The encapsulating epoxy used in this test was Morton Polyset 410B. FIG. 2 illustrates samples of CDA copper strips coated with glassy-like phosphate and bonded together with Morton Polyset 410B. Comparison of FIGS. 1 and 2 indicates that the median bond strength is nearly double for the coated copper alloy samples as compared to the clean samples of the same alloy.

FIG. 3 illustrates the experimental results of a durability test. The durability test measures the effect of the moisture on the bond strength. The data illustrated resulted from bonding coated and uncoated copper alloy CDA 194 strips with an encapsulating epoxy, Morton Polyset 410B. The epoxy was cured for 24 hours at 165° C. Then, the bonded strips were placed in boiling water for different amounts of time. Afterwards, they were pulled apart using the aforementioned lap strength test. The slope through the median of the bond strength ranges of the coated and uncoated or clean copper 194 indicates that the coated alloy had a larger bond strength. This is an example of a specific cure cycle. The same type of effects can be expected with any equivalent cure cycle. Even in an uncured condition, specific bond improvement of about 285 PSI for coated copper alloy vs. 200 PSI for uncoated copper alloy was found.

The durability tests indicate the increased bond strength of coated strip in accordance with the present invention, as compared to uncoated strip when both were subjected to similar conditions of heat and moisture. The test is a strong indicator of the hermeticity of a package comprising a semiconductor device attached to a leadframe and encapsulated with epoxy containing mold release agents as well as inert fillers. The hermeticity has been substantiated by vacuum testing plastic metal adhesion bonds with and without the adhesion primers. In the absence of an adhesion primer, no vacuum is obtained. However, with coated samples, vacuum measuring in the range of $10^{-6}$ and $10^{-7}$ Torr was achieved.

The coating of the present invention is thought to provide an additional advantage in preventing bond failure in the shear mode due to differences in thermal expansion between the metal and the epoxy. The expansion coefficient of epoxy may be different from the expansion coefficient of the copper or copper alloy. For example, the coefficient of thermal expansion of copper is $10 \times 10^{-6}$ in/in/°C. and the coefficient of linear expansion of a typical encapsulating epoxy is $27 \times 10^{-6}$ in/in/°C. The difference in coefficient of expansions creates a high shear stress condition when the composite is placed in a cyclic temperature environment. However, the adhesion primers of the present invention are thought to be slightly flexible and have been shown to adjust to some expansion. The improved bond strength achieved with the present invention should prevent bond failure over a wider shear displacement range, such as exists in the range of temperatures between −50° C. and 165° C. These temperatures present the extremes in which these devices are normally used. This may be particularly important in adverse environmental condition where encapsulated semiconductor devices are used.

The patents and publications set forth in the specification are intended to be incorporated by reference herein.

It is apparent that there has been provided in accordance with this invention a copper plastic composite and a method of forming the composite which fully satisfies the objects, means, and advantages set forth hereinabove. While the invention has been described in combination with the specific embodiments thereof, it is evident that many alternatives, modifications, and variations will be apparent to those skilled in the art in light of the foregoing description. Accordingly, it is intended to embrace all such alternatives, modifications, and variations as fall within the spirit and broad scope of the appended claims.

We claim:

1. A process of forming a metal plastic composite, comprising the steps of:
    a. selecting said metal from the group consisting of copper and copper alloys;
    b. coating the surface of said metal with an adhesion primer comprising a substantially glassy-like, pore-free phosphate coating;
    c. rinsing said metal;
    d. drying said metal; and
    e. adhesively bonding a plastic material comprising an epoxide resin and a mold release agent to the surface of the copper or copper alloy metal having said adhesion primer.

2. The process as in claim 1 including the step of selecting said plastic material from an epoxide resin formulated as a thermosetting encapsulating epoxy.

3. The process as in claim 1 including the step of adding inert fillers to said plastic material to provide dimensional stability.

4. The process as in claim 3 including the step of selecting said mold release agent from a group of low melting temperature organics.

5. The process as in claim 4 including the step of selecting said mold release agent from the group consisting of silicones, stearates and fatty acids.

6. The process as in claim 2 further including the step of forming said metal into a leadframe.

7. The process as in claim 6 further including the step of connecting an electrical or electronic component to said leadframe, whereby said component is encapsulated by said epoxide resin.

8. The process as in claim 1 wherein said step of coating the surface of said metal includes immersing said metal in a phosphoric acid solution of at least 8 percent concentration and containing from 3.5 grams per liter up to the solubility limit of a material selected from the group consisting of sodium dichromate and potassium dichromate and mixtures thereof for at least 2 seconds to form a substantially pore-free coating of copper phosphate, provided that when the concentration of phosphoric acid is increased, the minimum dichromate concentration is proportionately increased.

9. The process as in claim 1 wherein the coating step includes immersing said metal in a solution containing an organophosphonic acid and a chromate free oxidizing agent for at least 4 seconds to coat the surface of said metal with a compound of said organophosphonic acid.

* * * * *